US011213124B2

(12) United States Patent
Chen et al.

(10) Patent No.: US 11,213,124 B2
(45) Date of Patent: Jan. 4, 2022

(54) SLIDE RAIL ASSEMBLY AND RAILS MOUNTING METHOD THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 17/067,752

(22) Filed: Oct. 11, 2020

(65) Prior Publication Data
US 2021/0353059 A1    Nov. 18, 2021

(30) Foreign Application Priority Data
May 12, 2020 (TW) ................ 109115958

(51) Int. Cl.
A47B 88/00 (2017.01)
F16C 29/04 (2006.01)
A47B 88/493 (2017.01)

(52) U.S. Cl.
CPC ............ *A47B 88/493* (2017.01); *F16C 29/04* (2013.01)

(58) Field of Classification Search
CPC ............ A47B 88/4272; A47B 88/4274; A47B 88/493; F16C 29/04; F16C 29/045; F16C 29/046; F16C 2314/72
See application file for complete search history.

(56) References Cited

U.S. PATENT DOCUMENTS

| 6,220,683 | B1 | 4/2001 | Chu |
| 8,780,565 | B2 | 7/2014 | Henderson |
| 10,260,556 | B2 * | 4/2019 | Chen ............. A47B 88/407 |
| 2006/0244349 | A1 | 11/2006 | Chen |
| 2015/0091429 | A1 | 4/2015 | Kruse |
| 2017/0119153 | A1 | 5/2017 | Chen |

FOREIGN PATENT DOCUMENTS

| CN | 110893055 B * | 7/2021 |
| EP | 3 451 808 A1 | 3/2019 |
| JP | 2018-121915 A | 8/2018 |
| JP | 2019-37749 A | 3/2019 |
| JP | 2020-39847 A | 3/2020 |

* cited by examiner

*Primary Examiner* — Phillip A Johnson
(74) *Attorney, Agent, or Firm* — Winston Hsu

(57) ABSTRACT

A slide rail assembly includes a first rail, a supporting member and a second rail. The supporting member is arranged on the first rail and includes a first supporting portion, a second supporting portion and a guiding portion arranged between the first supporting portion and the second supporting portion. When the second rail is mounted into the passage of the first rail, the first supporting portion is configured to support the second rail. When the second rail is moved along a mounting direction, the second rail is guided to the second supporting portion through the guiding portion.

20 Claims, 15 Drawing Sheets

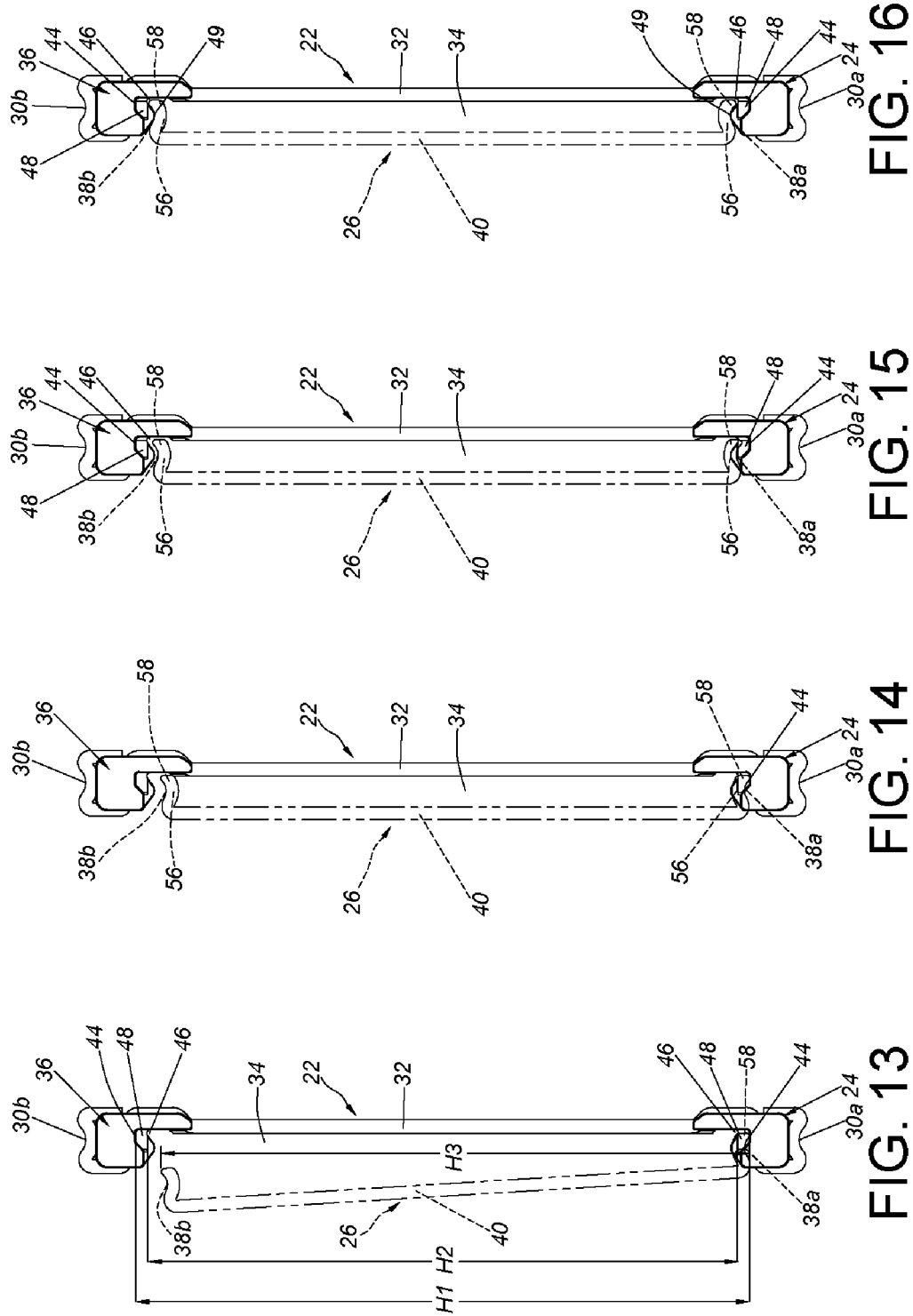

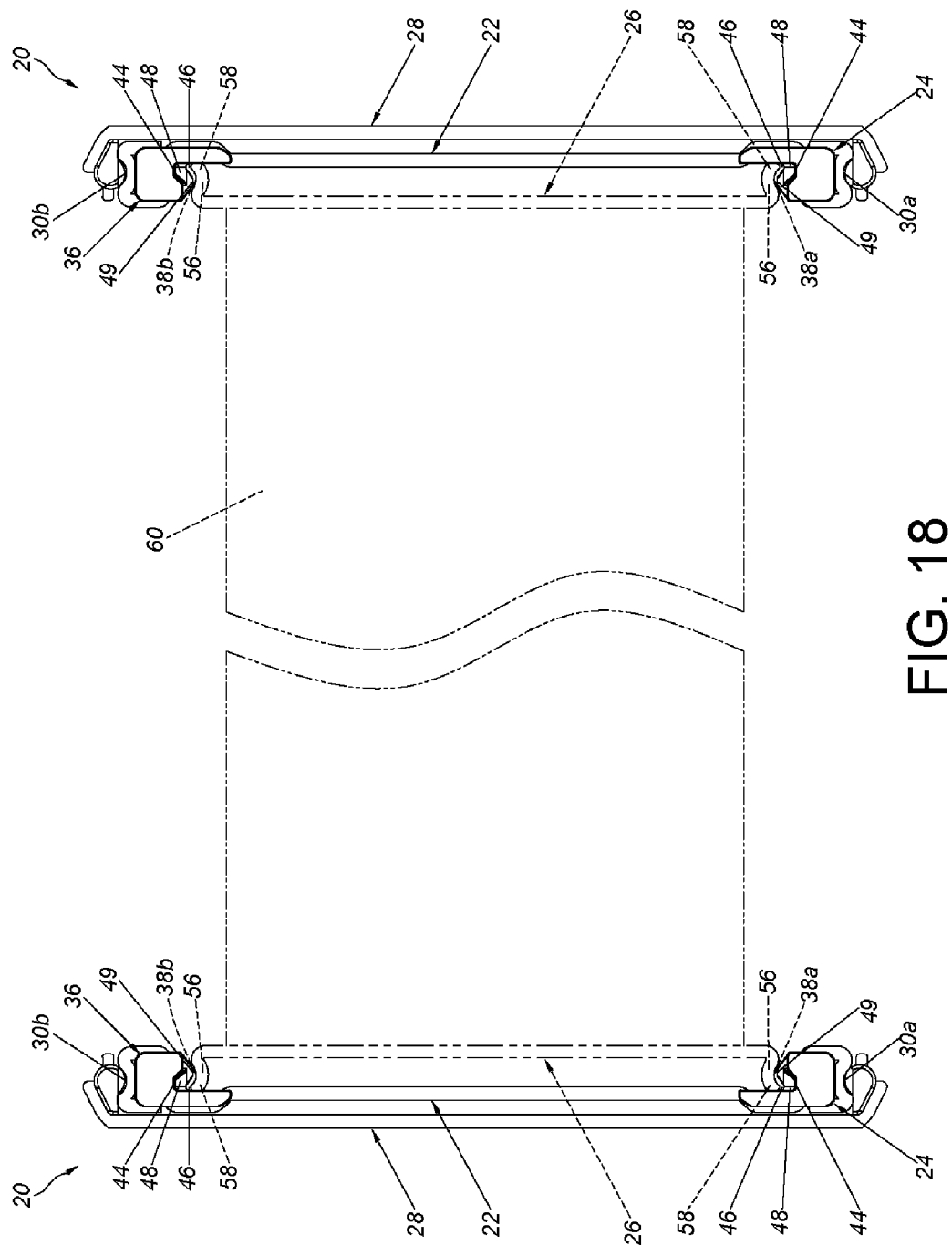

SLIDE RAIL ASSEMBLY AND RAILS MOUNTING METHOD THEREOF

BACKGROUND OF THE INVENTION

1. Field of the Invention

The present invention relates to a slide rail assembly and a rails mounting method thereof, and more particularly, to a slide rail which is easy to insert into another slide rail and has support reliability when the slide rail is pulled out from the other slide rail and then reinserting into the other slide rail.

2. Description of the Prior Art

As shown in FIG. 1A and FIG. 1B, a rack cabinet 102 is located in an apparatus room 100. The rack cabinet 102 accommodates a plurality of chassis 104a to 104f. After the chassis 104c is dismounted from the rack cabinet 102 to be maintained, the chassis 104c has to be mounted into rack cabinet 102 again. Although the chassis 104c can be supported by an auxiliary equipment 106 (such as a trolley), the chassis 104c can be adjusted to a corresponding level position relative to the rack cabinet 102, such that an end portion of an inner rail 108 mounted on the chassis 104c can aligned with an intermediate rail 110 mounted on the rack cabinet 102, and then the chassis 104c is pushed into the rack cabinet 102 by a force along a direction F. The inner rail 108 of the chassis 104c is able to be connected to the intermediate rail 110 of the rack cabinet 102, such that the chassis 104c can be accommodated in the rack cabinet 102. However, the chassis in a relatively lower position in the rack cabinet 102 (e.g. chassis 104d to 104f) is easily limited by the height of the auxiliary equipment 106, such that there are limitation in use the auxiliary equipment 106, and the chassis has to be mounted manually. On the other hand, purchase of the auxiliary equipment 106 is an additional cost.

As shown in FIG. 2A and FIG. 2B, the chassis 104d is manually mounted into the rack cabinet 102. Wherein, the chassis 104d has a certain weight, if both sides of the chassis 104d are supported by a single user or by two users (one user support one side of the chassis), the chassis 104d may be tilted in both way. Therefore, when the chassis 104d is in a tilted state a, the end portion of the inner rail 108 of the chassis 104d is also tilted. Two enlarged figures in FIG. 2B shows two problems. There is "interference" between the inner rail 108 of the chassis 104d and the intermediate rail 110 of the rack cabinet 102 (as shown in the upper enlarged figure) and the problem of "misalignment and large gap" (as shown in the lower enlarged figure).

SUMMARY OF THE INVENTION

The present invention relates to a slide rail assembly having the characteristics of a slide rail being easily to insert into another slide rail and support reliability during the process of extracting the slide rail relative to another slide rail and then reinserting it.

According to an aspect of the present invention, a slide rail assembly includes a first rail, a first supporting member and a second rail. The first rail includes a first wall, a second wall and a first longitudinal wall connected between the first wall and the second wall. A passage is defined by the first wall, the second wall and the first longitudinal wall. The first supporting member is arranged on the first rail. The first supporting member includes a first supporting portion, a second supporting portion and a guiding portion arranged between the first supporting portion and the second supporting portion. The first supporting portion has a first transverse width. The second supporting portion has a second transverse width, and the first transverse width being greater than the second transverse width. Wherein, when the second rail is mounted into the passage of the first rail from outside of the passage of the first rail, the first supporting portion is configured to support the second rail. When the second rail is moved along a mounting direction, the second rail is guided to the second supporting portion through the guiding portion and the second supporting portion is configured to support the second rail.

Preferably, the guiding portion has an inclined surface or an arc surface.

Preferably, a height difference is formed between the first supporting portion and the second supporting portion.

Preferably, the first supporting member is located on an entrance of the passage adjacent to the first wall of the first rail, the first supporting member further comprises an identifying features located around the entrance.

Preferably, the slide rail assembly further includes a second supporting member arranged on the first rail. The second supporting member is located on the entrance of the passage adjacent to the second wall of the first rail. Wherein, the second supporting member and the first supporting member have substantially a same structural configuration.

Preferably, a first height is defined between the first supporting portion of the first supporting member and the first supporting portion of the second supporting member. A second height is defined between the second supporting portion of the first supporting member and the second supporting portion of the second supporting member. The first height is greater than the second height.

Preferably, the second rail comprising a third wall, a fourth wall and a second longitudinal wall connected between the third wall and the fourth wall. A third height is defined between the third wall and the fourth wall. The first height is greater than the third height.

Preferably, a longitudinal length of the third wall of the second rail is substantially greater than a longitudinal length of the fourth wall.

Preferably, the third wall of the second rail includes an arc section and an end section connected to the arc section. The first supporting member further includes a third supporting portion adjacent to the second supporting portion. When the second rail is mounted into the passage of the first rail from outside of the passage of the first rail, the first supporting portion of the first supporting member is configured to support the end section of the third wall of the second rail. When the second rail is moved along the mounting direction, the second rail is guided to the second supporting portion through the guiding portion of the first supporting member. The second supporting portion of the first supporting member is configured to support the end section of the third wall of the second rail. The third supporting portion of the first supporting member is configured support the arc section of the third wall of the second rail.

Preferably, when the second rail is mounted into the passage of the first rail, the third wall, the fourth wall and the second longitudinal wall of the second rail are respectively adjacent to the first wall, the second wall and the first longitudinal wall of the first rail.

According to another aspect of the present invention, a slide rail assembly includes a first rail, a sliding auxiliary device, a first supporting member and a second rail. The first rail includes a first wall, a second wall and a first longitudinal wall connected between the first wall and the second wall. A passage is defined by the first wall, the second wall and the first longitudinal wall. The sliding auxiliary device is arranged in the passage of the first rail. The sliding auxiliary device includes a plurality of rolling members. The first supporting member is arranged on the first rail, the first supporting member comprising a first supporting portion, a second supporting portion and a guiding portion arranged between the first supporting portion and the second supporting portion. Wherein, when the second rail is mounted into the passage of the first rail from outside of the passage of the first rail, the first supporting portion is configured to support the second rail. When the second rail is moved along a mounting direction, the second rail is guided to the second supporting portion through the guiding portion. The second supporting portion is configured to support the second rail. Wherein, when the second rail is further moved along the mounting direction and mounted into the passage of the first rail, the plurality of rolling members of the sliding auxiliary device are configured to support the second rail.

According to another aspect of the present invention, a rail mounting method includes: providing a first rail having a passage, a slide auxiliary device being arranged in the passage of the first rail, the sliding auxiliary device comprising a plurality of rolling members; providing a first supporting member arranged on the first rail and located on an entrance of the passage, the first supporting member comprising a first supporting portion, a second supporting portion and a guiding portion arranged between the first supporting portion and the second supporting portion, a height difference is formed between the first supporting portion and the second supporting portion; providing a second rail, wherein when the second rail is mounted into the passage of the first rail from outside of the passage of the first rail, the first supporting portion of the first supporting member is configured to support the second rail; and moving the second rail along a mounting direction, such that the second rail is guided to the second supporting portion through the guiding portion, wherein when the second rail is further moved along the mounting direction, the plurality of the rolling members of the sliding auxiliary device are configured to support the second rail.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 13 is a diagram illustrating the second rail of the slide rail assembly able to be tilted and being supported by a first supporting portion of the first supporting member of the first rail according to the embodiment of the present invention.

FIG. 14 is a diagram illustrating the second rail of the slide rail assembly may be located at an installation preparing location and being supported by a first supporting portion of the first supporting member of the first rail according to the embodiment of the present invention.

FIG. 15 is a diagram illustrating the second rail of the slide rail assembly able to be guided by a guiding portion of the first supporting member of the first rail according to the embodiment of the present invention.

FIG. 16 is a diagram illustrating the second rail of the slide rail assembly able to be supported by a second supporting portion of the first supporting member of the first rail according to the embodiment of the present invention.

FIG. 18 a diagram illustrating the two second rails of the two slide rail assemblies respectively arranged on two sides of the carried object, and every second rail able to be supported by every corresponding second supporting portion of the first supporting member of the first rail according to the embodiment of the present invention.

DETAILED DESCRIPTION

Figure 1A:
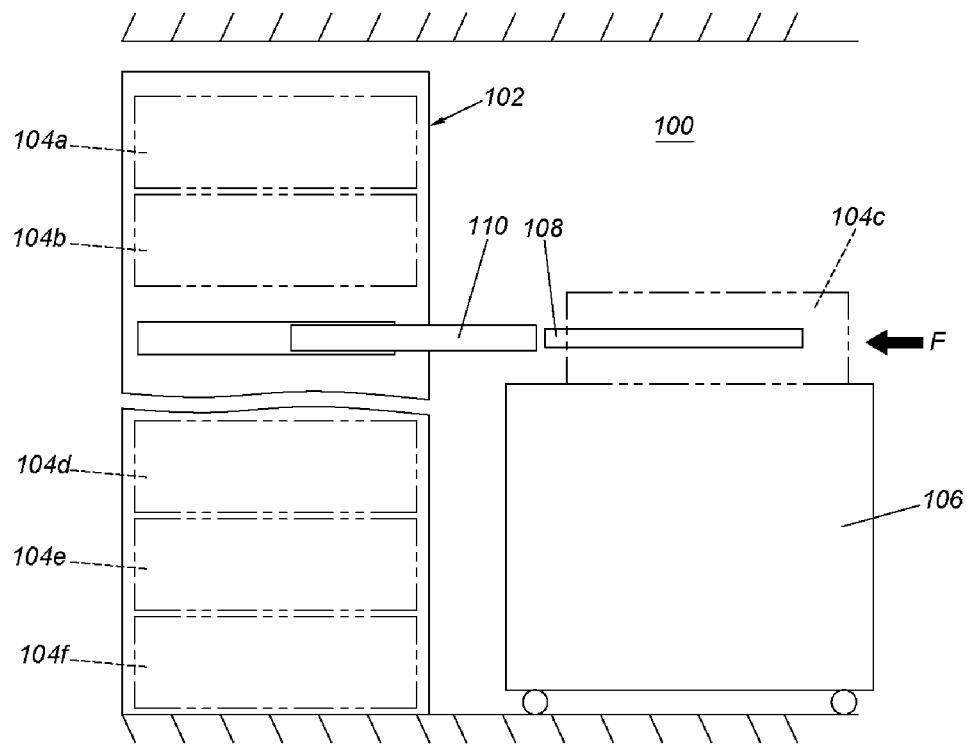
FIG. 1A is a side view illustrating a plurality of slide rail assemblies arranged on a cabinet, and an inner rail arranged on a chassis able to be mounted on an intermediate rail of the cabinet through an auxiliary equipment according to prior art.
Figure 1B:
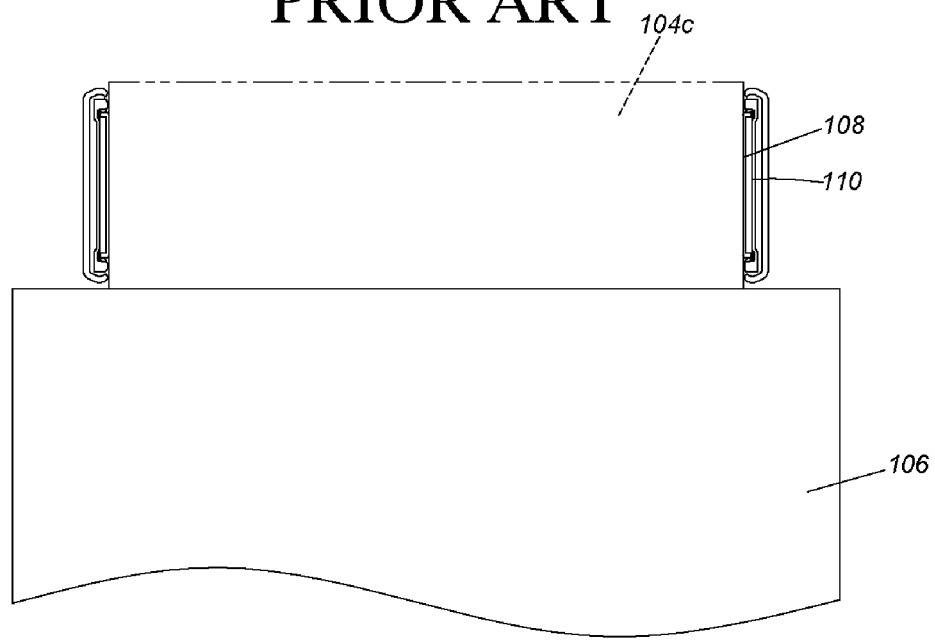
FIG. 1B is a front view illustrating the inner rail of the chassis able to be mounted into the intermediate rail through the auxiliary equipment according to prior art.
Figure 2A:
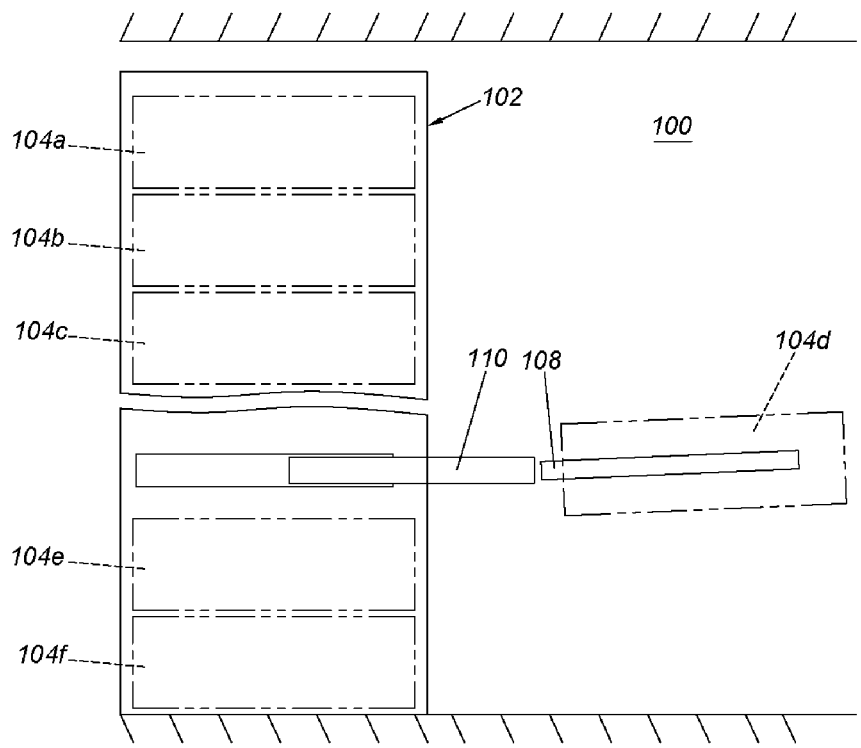
FIG. 2A is a side view illustrating the plurality of slide rail assemblies arranged on the cabinet, and the inner rail arranged on a chassis being manually mounted on the intermediate rail of the cabinet according to prior art.
Figure 2B:
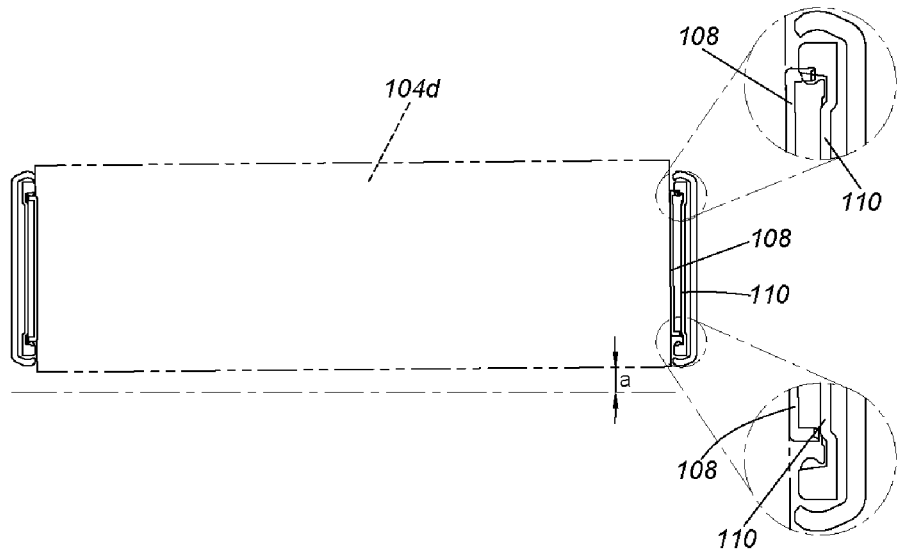
FIG. 2B is a front view illustrating the inner rail of the chassis being manually mounted into the intermediate rail, and interference and misalignment between the inner rail and the intermediate rail due to oblique installation according to prior art.
Figure 3:
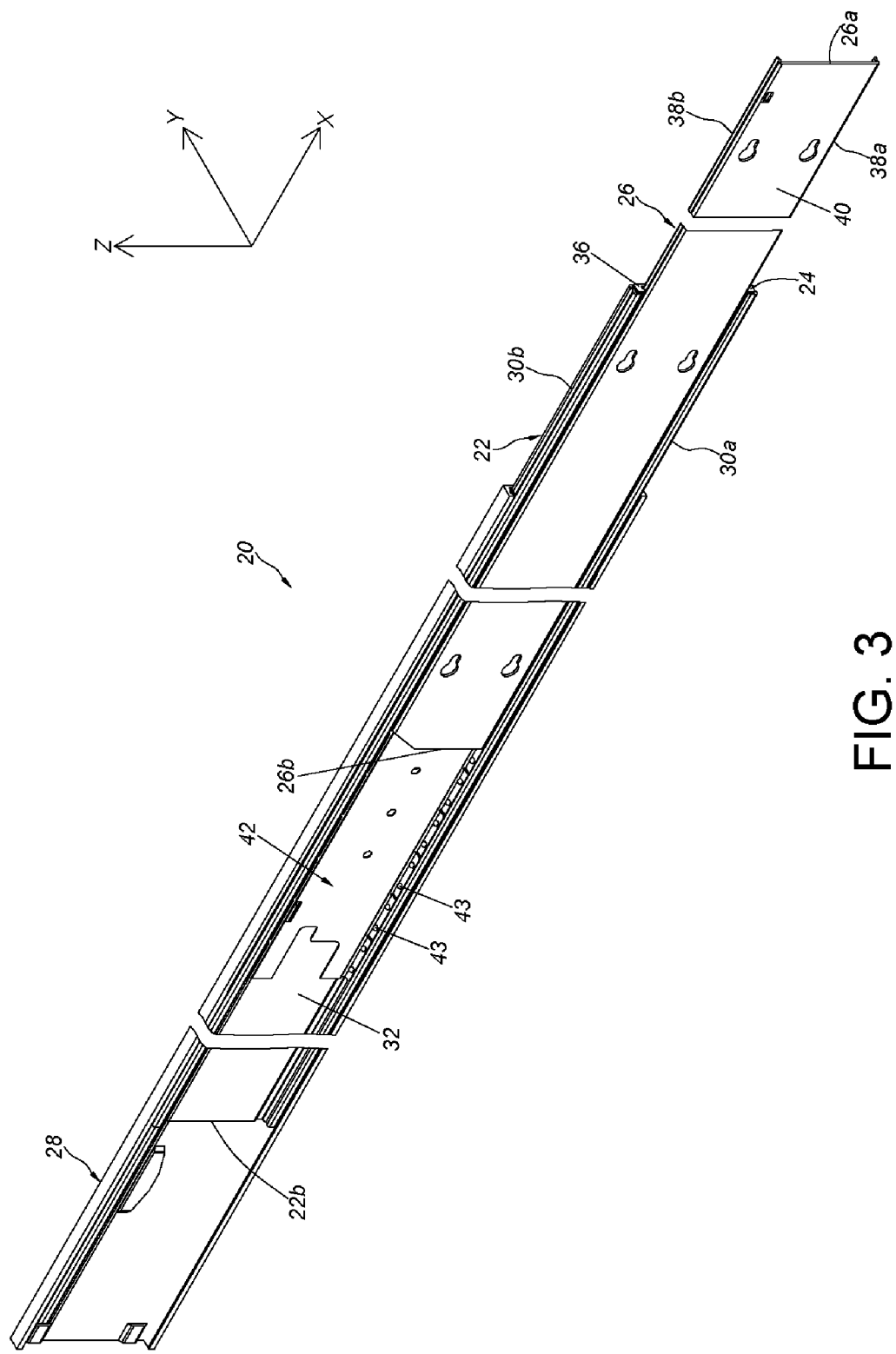
FIG. 3 is a diagram illustrating a slide rail assembly including a first rail, a second rail and a third rail according to an embodiment of the present invention.
Figure 4:
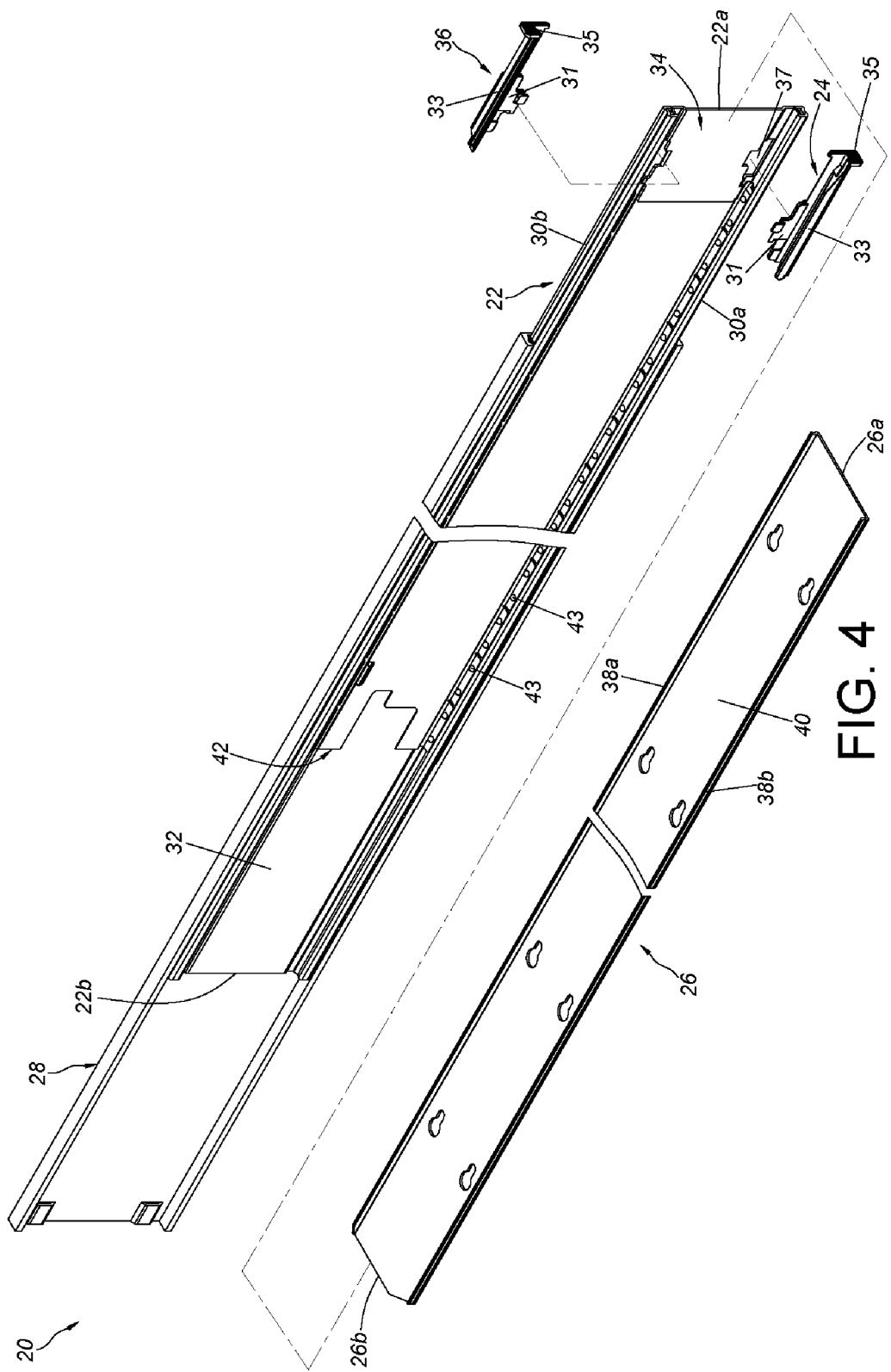
FIG. 4 is an exploded view illustrating the slide rail assembly including the first rail, the second rail, the third rail, a first supporting member and a second supporting member according to the embodiment of the present invention.

As shown in FIG. 3 and FIG. 4, a slide rail assembly 20 of an embodiment of the present invention includes a first rail 22, a first supporting member 24 and a second rail 26. Preferably, the slide rail assembly 20 further includes a third rail 28. The first rail 22 is movably mounted between the third rail 28 and the second rail 26 to form a three-section slide rail assembly. The first rail 22, the second rail 26 and the third rail 28 are movable relative to each other. In the description below, it will be understood that an X-axis direction is a direction that two slide rails of a slide rail assembly are movable relative to each other when the two slide rails are mounted together (or a length/longitudinal direction of the slide rail). It will also be understood that a Y-axis direction is a transverse direction (or a lateral direction of the slide rail), and a Z-axis direction is a vertical direction (or a height direction of the slide rail which is perpendicular to the length/longitudinal direction and the lateral direction of the slide rail).

The first rail 22 includes a first wall 30a, a second wall 30b and a first longitudinal wall 32 connected between the first wall 30a and the second wall 30b. A passage 34 is defined by the first wall 30a, the second wall 30b and the first longitudinal wall 32, and configured to accommodate the second rail 26. The first rail 22 has a first end portion 22a, which may also be called a front end portion, and a second end portion 22b, which may also be called a rear end portion.

The first supporting member 24 is fixedly arranged on the first rail 22 and adjacent to the first end portion 22a. Furthermore, the first supporting member 24 is arranged adjacent to the first wall 30a of the first rail 22 and located on an entrance of the passage 34 (such as an entry of the passage 34), wherein the entry is arranged at the first end portion 22a (the front end portion). The first supporting member 24 includes a connecting portion 31, a main body portion 33 and an identifying feature 35. The connecting portion 31 is configured to be connected to a mounting feature 37 of the first longitudinal wall 32 of the first rail 22. Wherein, the connecting portion 31 may be connected to the mounting feature 37 by engaging or fastening. In another embodiment, the connecting portion 31 may be connected to the mounting feature 37 by riveting, screwing, or welding, but the present invention is not limited thereto. The main body portion 33 is connected to the connecting portion 31, and the main body portion 33 substantially has a longitudinal length. The identifying features 35 is arranged on an end portion of the main body portion 33, and the identifying features 35 is located around the entrance of the first rail 22. For example, the identifying features 35 is painted with a special color or has a special shape to provide a maintenance staff can visually identify location of the entrance of the first rail 22 according to the identifying features 35.

Preferably, the slide rail assembly 20 further includes a second supporting member 36 fixedly arranged on the first rail 22 and adjacent to the first end portion 22a. Preferably, the first supporting member 24 and the second supporting member 36 are made of zinc alloy material. Furthermore, the second supporting member 36 is arranged adjacent to the second wall 30b of the first rail 22 and located on the entrance of the passage 34. The second supporting member 36 and the first supporting member 24 have substantially a same structural configuration. The second supporting member 36 and the first supporting member 24 are arranged on the first rail 22 with a same arrangement method. As a result, Components with denoted in the second supporting member 36 identical to those in the first supporting member 24 have identical structures and functions, and further description is omitted herein for simplicity.

The second rail 26 is longitudinally movable relative to the first rail 22 through the passage 34 of the first rail 22, and the second rail 26 is able to be detached from the passage 34 of the first rail 22. This arrangement is obvious to those skilled in the art. For simplification, no further illustration is provided. The second rail 26 has a first end portion 26a, which may be also called a front end portion, and a second end portion 26b, which may be also called a second end portion.

Preferably, the second rail 26 includes a third wall 38a, a fourth wall 38b and a second longitudinal wall 40 connected between the third wall 38a and the fourth wall 38b. A longitudinal length of the third wall 38a of the second rail 26 is substantially greater than a longitudinal length of the fourth wall 38b. For example, the fourth wall 38b of the second end portion 26b of the second rail 26 and a part of the second longitudinal wall 40 are cut to form a inclined side or an oblique angle, such that the longitudinal length of the third wall 38a of the second rail 26 is substantially greater than the longitudinal length of the fourth wall 38b.

Preferably, when the second rail 26 has mounted into the passage 34 of the first rail 22, the third wall 38a, the fourth wall 38b and the second longitudinal wall 40 of the second rail 26 are located respectively adjacent to the first wall 30a, the second wall 30b and the first longitudinal wall 32 of the first rail 22. The slide rail assembly 20 further includes a slide auxiliary device 42 movably mounted in the passage 34 of the first rail 22. The slide auxiliary device 42 includes a plurality of rolling members 43 (e.g. balls or rollers) configured to support the second rail 26, in order to improve the smoothness of moving between the second rail 26 and the first rail 22.

Figure 5:
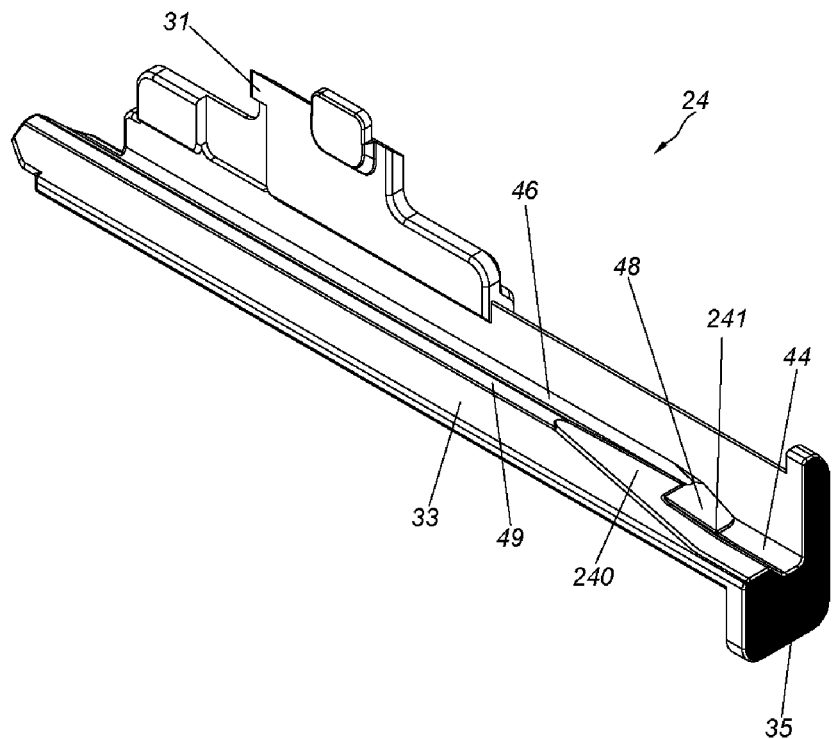
FIG. 5 is a diagram illustrating the first supporting member according to the embodiment of the present invention.
Figure 6:
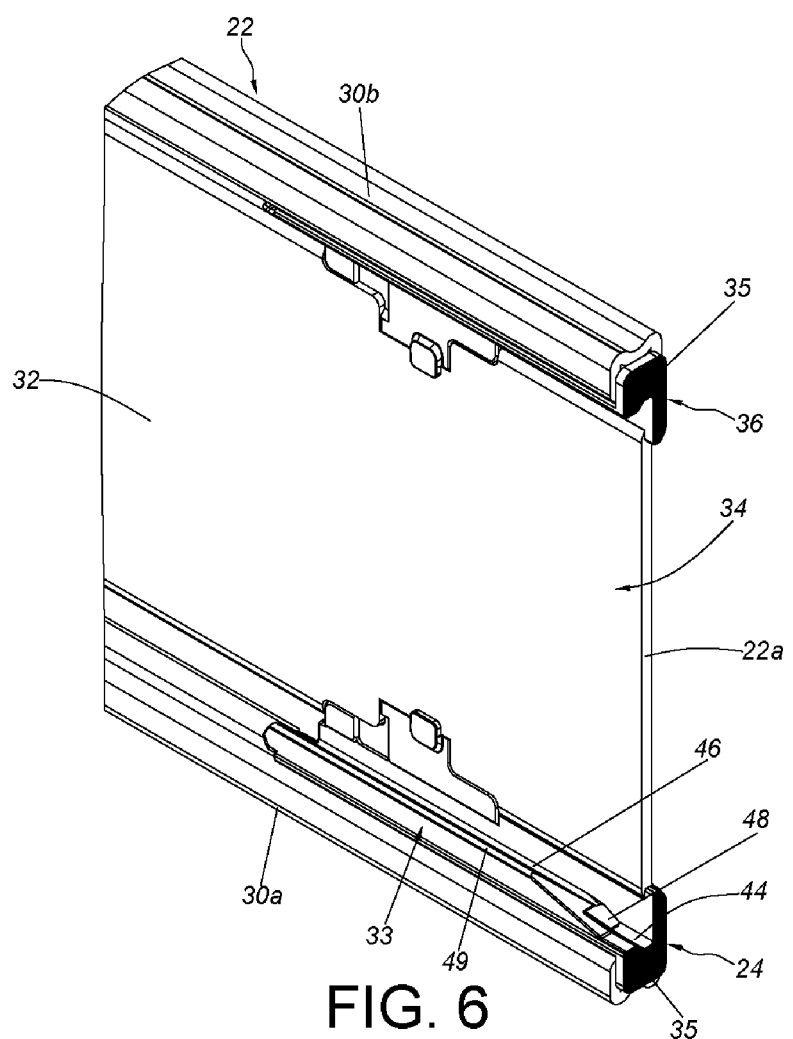
FIG. 6 is a diagram illustrating a part of the first rail according to the embodiment of the present invention.
Figure 7:
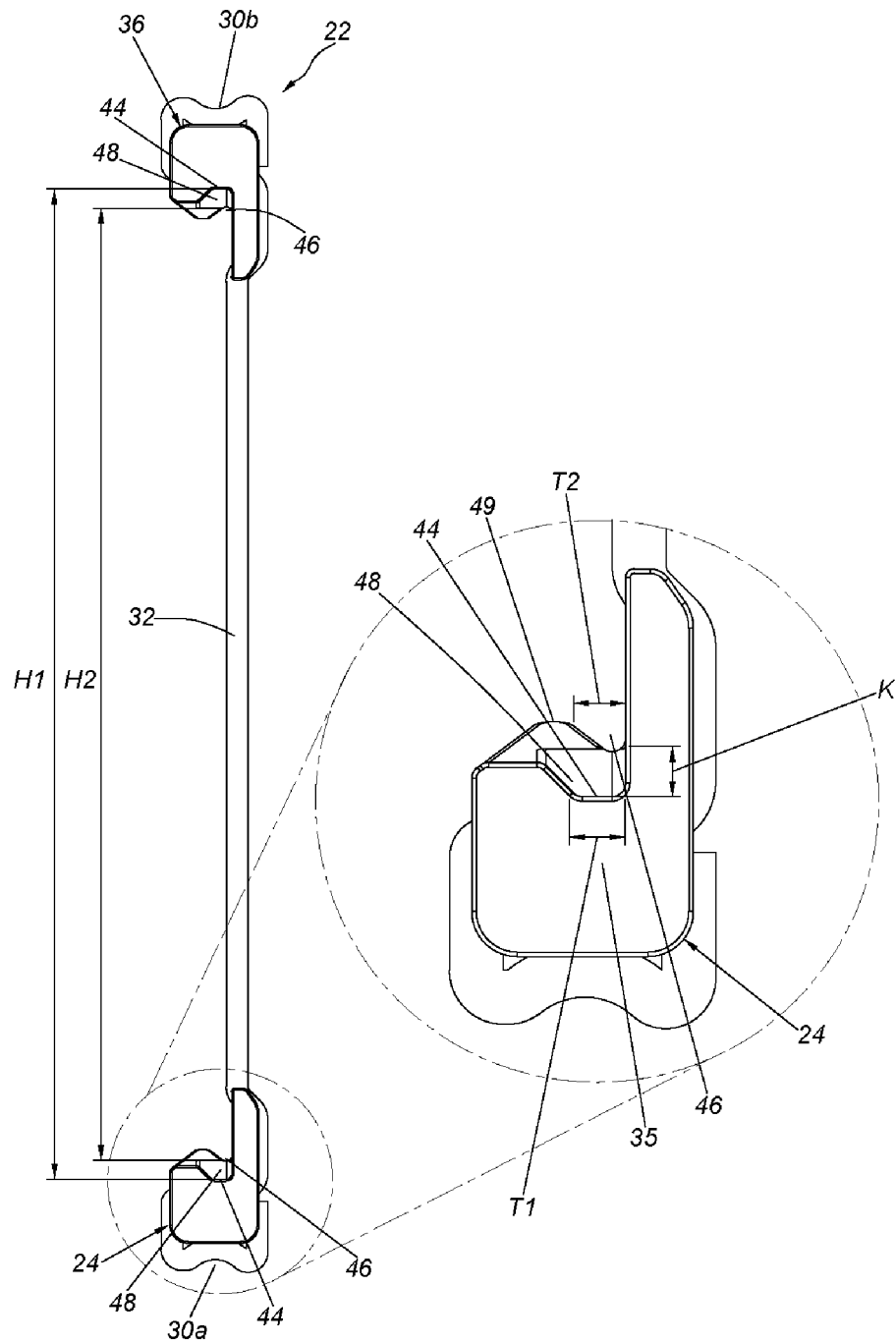
FIG. 7 is a cross-section diagram illustrating the first rail according to the embodiment of the present invention.

As shown in FIGS. 5, 6 and 7, each supporting member 24, 36 (such as the main body portion 33 of the first supporting member 24) includes a first supporting portion 44, a second supporting portion 46 and a guiding portion 48 arranged between the first supporting portion 44 and the second supporting portion 46. The first supporting portion 44 has a first transverse width T1, and the second supporting portion 46 has a second transverse width T2. The first transverse width T1 is greater than the second transverse width T2. In the present embodiment, the first supporting portion 44 and the second supporting portion 46 are two recessed slots, but the present invention is not limited thereto.

Preferably, each supporting member 24, 36 (such as the main body portion 33 of the first supporting member 24) further includes a third supporting portion 49 adjacent to the second supporting portion 46.

Preferably, the guiding portion 48 has an inclined surface or an arc surface.

Preferably, a height difference K is formed between the first supporting portion 44 and the second supporting portion 46 (as shown in FIG. 7).

Preferably, when the first supporting member 24 and the second supporting member 36 are respectively mounted to the first wall 30a and the second wall 30b of the first rail 22, a first height H1 is defined between the first supporting portion 44 of the first supporting member 24 and the first supporting portion 44 of the second supporting member 36. A second height H2 is defined between the second supporting portion 46 of the first supporting member 24 and the second supporting portion 46 of the second supporting member 36. Wherein, the first height H1 is greater than the second height H2 (as shown in FIG. 7).

Figure 8:
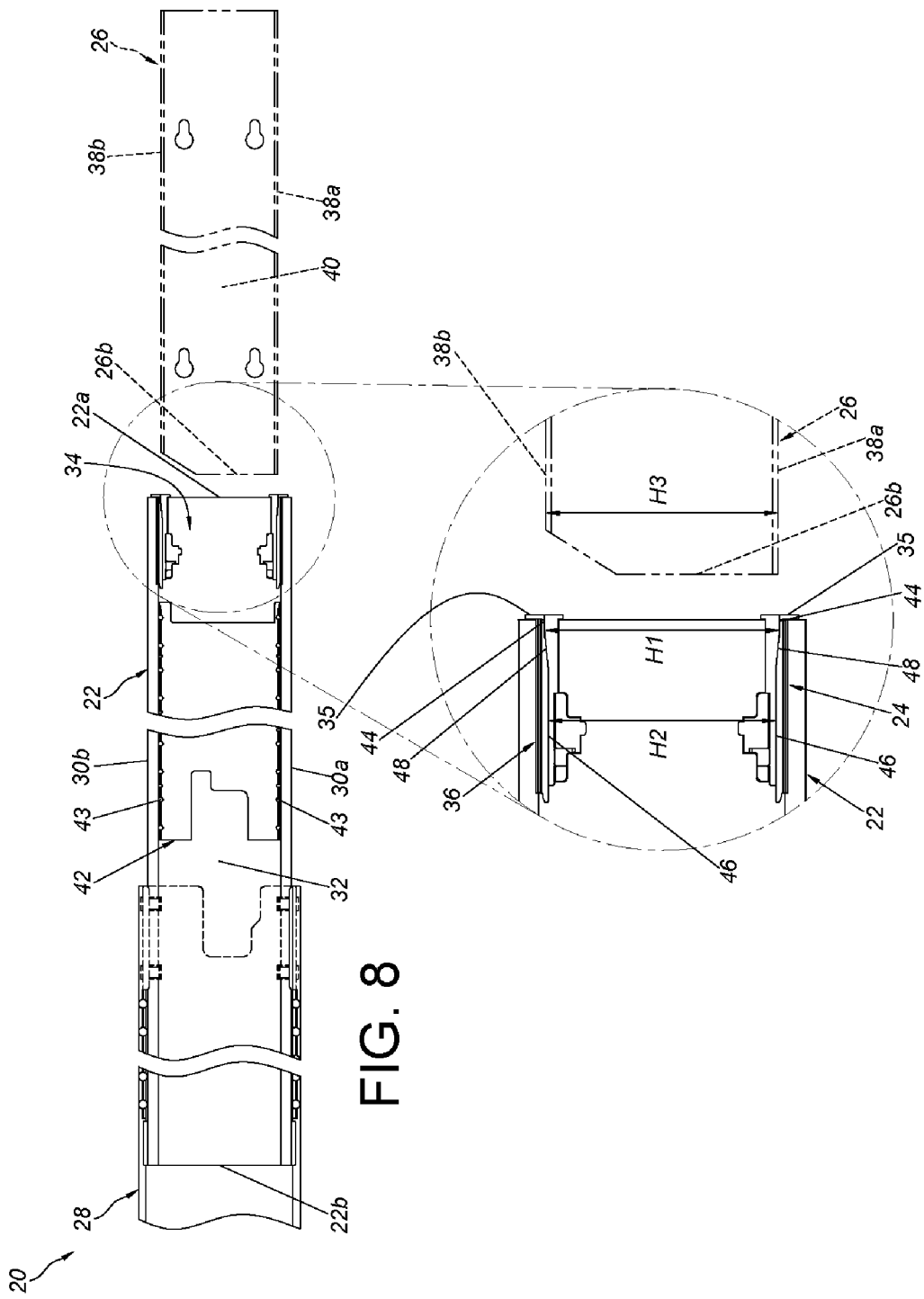
FIG. 8 is a diagram illustrating the second rail of the slide rail assembly able to be detached from the first rail according to the embodiment of the present invention.

As shown in FIG. 8, the second rail 26 is able to be detached from the passage 34 of the first rail 22. That is to say, the second rail 26 and the first rail 22 are away from each other. It is noticed that, a third height H3 is defined between the third wall 38a and the fourth wall 38b of the second rail 26, and the first height H1 is greater than the third height H3. In addition, when the second rail 26 is detached from the passage 34 of the first rail 22, the second rail 26 can be reinserted again according to the identifying feature 35 of each supporting member 24, 36. It is beneficial for the maintenance staff to align the second end portion 26b of the second rail 26 toward the entrance of the first rail 22 according to the identifying features 35, such that the second rail 26 is able to be easily mounted into the passage 34 of the first rail 22 again.

Figure 9:
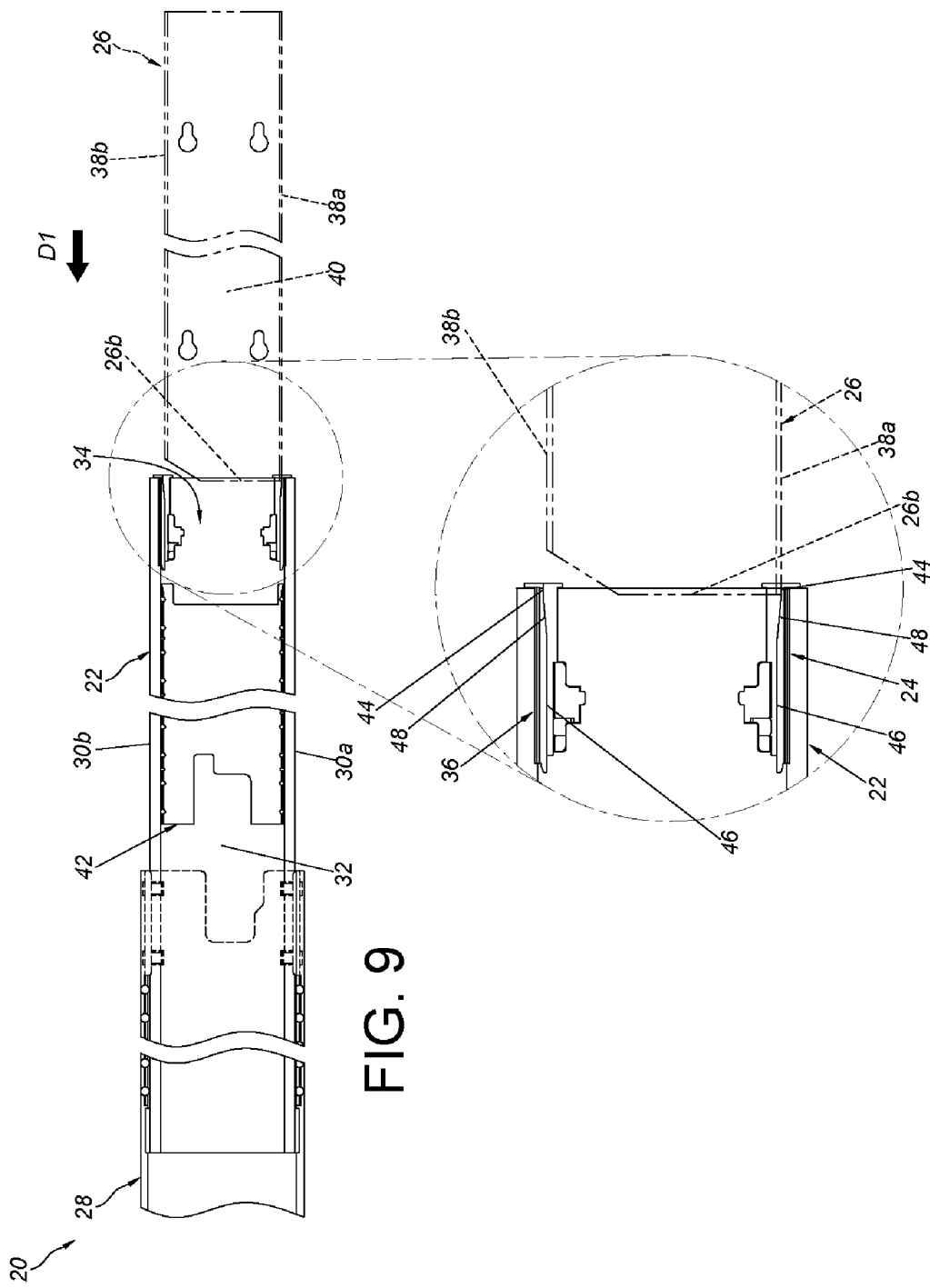
FIG. 9 is a diagram illustrating the second rail of the slide rail assembly able to be moved along a mounting direction to be mounted into the first rail according to the embodiment of the present invention.
Figure 10:
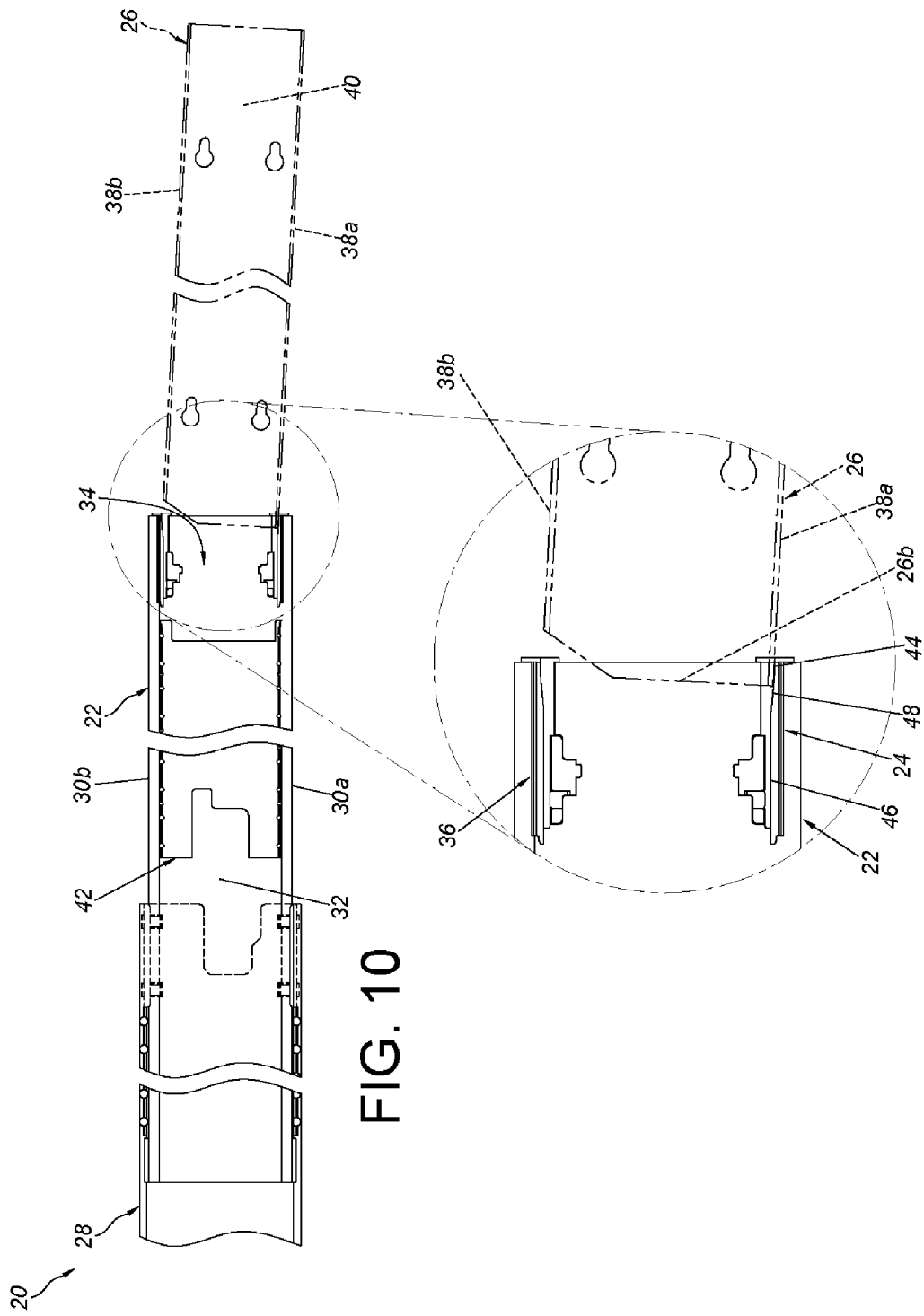
FIG. 10 is a diagram illustrating the second rail of the slide rail assembly being further moved along the mounting direction to be mounted into the first rail according to the embodiment of the present invention.
Figure 11:
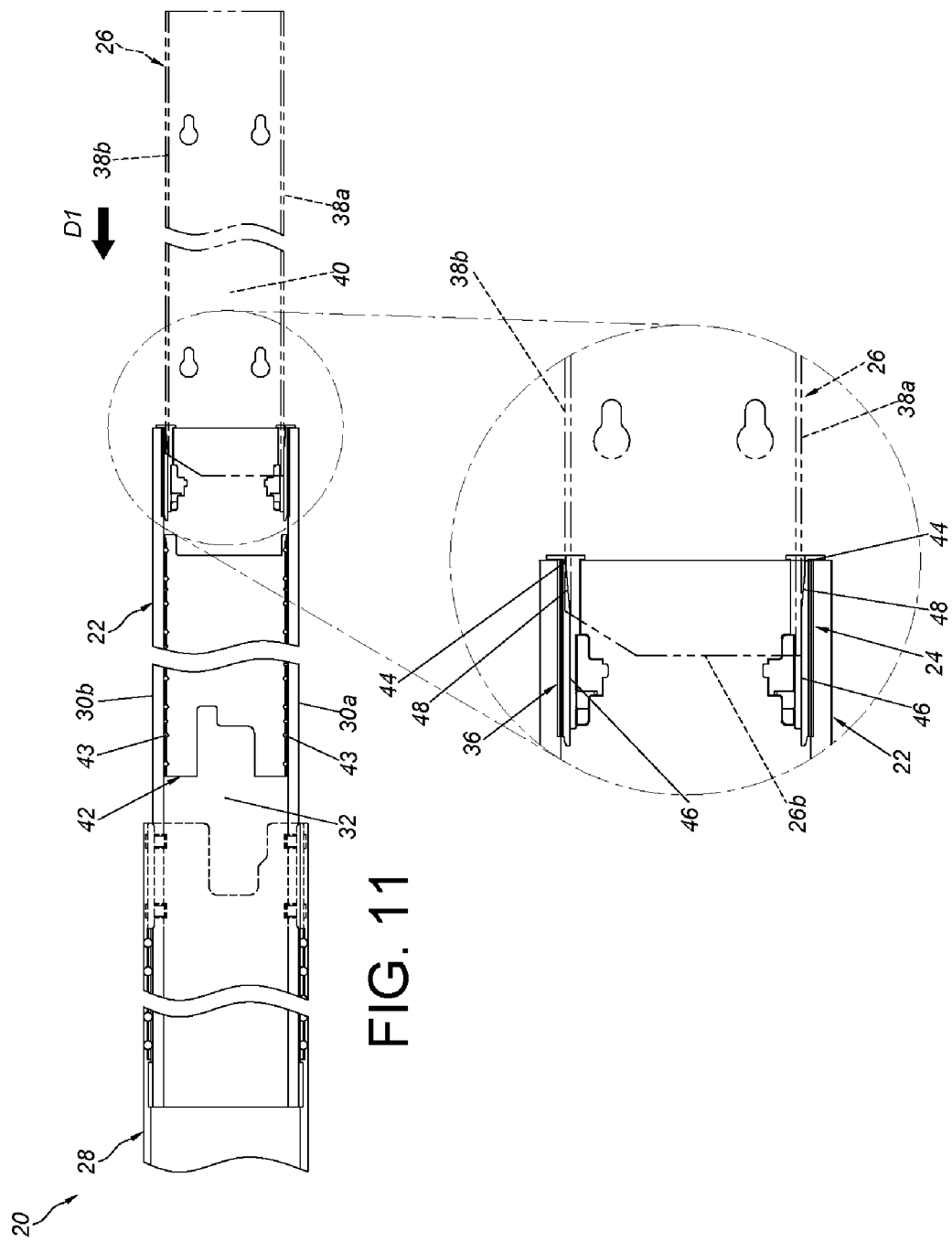
FIG. 11 is a diagram illustrating the second rail of the slide rail assembly being yet further moved along the mounting direction to be mounted into the first rail according to the embodiment of the present invention.

As shown in FIG. 8 to FIG. 11, when the second rail 26 is mounted into the passage 34 of the first rail 22 from outside of the passage 34 of the first rail 22, the first supporting portion 44 of the first supporting member 24 is configured to support the second rail 26 (as shown in FIG. 9). When the second rail 26 is moved along a mounting direction D1, the second rail 26 is guided to the second supporting portion 46 of the first supporting member 24 through the guiding portion 48 of the first supporting member 24 (as shown in FIG. 10), and the second supporting portion 46 of the first supporting member 24 is configured to support the second rail 26 (as shown in FIG. 11).

Preferably, during the process of mounting, the second end portion 26b of the second rail 26 is able to be easily inserted into the passage 34 from the entrance of the first rail 22 because the first height H1 is greater than the third height H3 (as shown in FIG. 8). Furthermore, a longitudinal length of the third wall 38a of the second rail 26 is substantially greater than a longitudinal length of the fourth wall 38b. Therefore, the third wall 38a of the second rail 26 can be supported by the first supporting portion 44 of the first supporting member 24 as a preliminary (as shown if FIG. 9). When the second rail 26 is moved along the mounting direction D1, the second rail 26 can be guided by the guiding portion 48 of the first supporting member 24 (as shown in FIG. 10) until the second rail 26 is located on the second supporting portion 46 of the first supporting member 24 (as shown in FIG. 11). In such status, the second supporting portion 46 of the first supporting member 24 and the second supporting portion 46 of the second supporting member 36 are able to respectively support the third wall 38a of the second rail 26 and the fourth wall 38b (as shown in FIG. 11).

Figure 12:
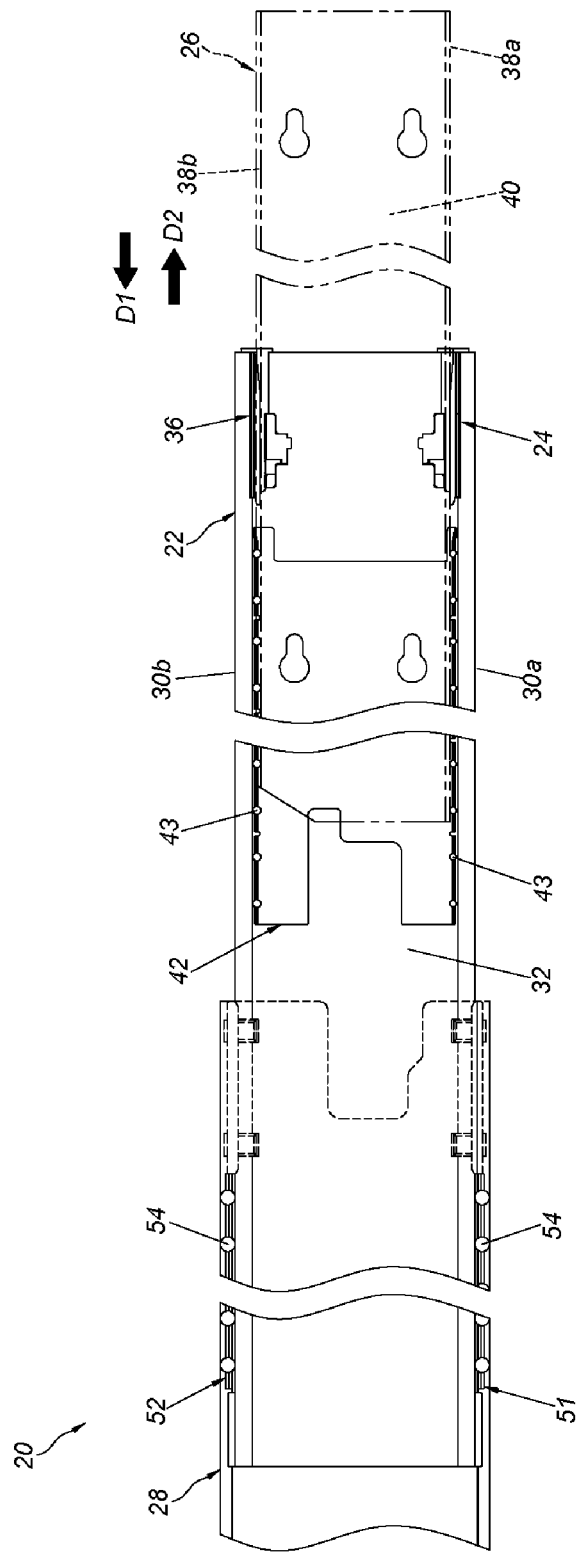
FIG. 12 is a diagram illustrating the second rail of the slide rail assembly having mounted into the first rail according to the embodiment of the present invention.

As shown in FIG. 12, when the second rail 26 is further moved along the mounting direction D1 and mounted into the passage 34 of the first rail 22, the plurality of rolling members 43 of the slide auxiliary device 42 are able to be configured to support the second rail 26. Preferably, the slide auxiliary device 42 includes a plurality of upper rolling members 43 and a plurality of lower rolling members 43 respectively configured to support the third wall 38a of the second rail 26 and the fourth wall 38b. Preferably, the slide rail assembly 20 further includes at least one slide auxiliary structure, such as a first slide auxiliary structure 51 and a second slide auxiliary structure 52. The first slide auxiliary structure 51 and the second slide auxiliary structure 52 both include a plurality of rolling features 54. The plurality of rolling features 54 (e.g. balls or rollers) are configured to support the first wall 30a of the first rail 22 and the second wall 30b, in order to improve the smoothness of moving between the first rail 22 and the third rail 28.

It is noticed that when the second rail 26 has mounted into the passage 34 of the first rail 22, the second rail 26 is able to be longitudinally moved along a detaching direction D2 opposite to the mounting direction D1 to be dismounted from the passage 34 of the first rail 22 (please refer to FIG. 8).

As shown in FIG. 13 to FIG. 16, the cross sections of the third wall 38a and the fourth wall 38b of the second rail 26 both include an arc section 56 and an end section 58. The arc section 56 is transversely (laterally) extended from the second longitudinal wall 40. Contour of the arc section 56 can correspond to contour of the plurality of rolling members 43 (e.g. rollers). The end section 58 is connected to the arc section 56.

Furthermore, due to the first height H1 is greater than the third height H3 (as shown in FIG. 13), when the second rail 26 is mounted into the passage 34 of the first rail 22 from outside of the passage 34 of the first rail 22, if a carried object is heavy or mounting space is small, the maintenance staff can insert the second rail 26 into the passage 34 from the entrance of the first rail 22 at an inclined angle (as shown in FIG. 13). The end section 58 of the third wall 38a of the second rail 26 can be supported by the first supporting portion 44 of the first supporting member 24 as a preliminary. Preferably, the first transverse width T1 of the first supporting portion 44 of the first supporting member 24 is substantially greater than a transverse width of the end section 58 of the third wall 38a of the second rail 26. Therefore, for the end section 58 of the third wall 38a of the second rail 26, a moving space formed by the first transverse width T1 to allow the end section 58 of the third wall 38a of the second rail 26 to easily insert into the space of the first transverse width T1 and be supported by the first supporting portion 44. On the other hand, through the first transverse width T1 of the first supporting portion 44 of the first supporting member 24 being substantially greater than the transverse width of the end section 58 of the third wall 38a of the second rail 26, a mounting tolerance between the first supporting portion 44 of the first supporting member 24 and the end section 58 of the third wall 38a of the second rail 26 is allowed. Thereby, the second rail 26 can be adjusted to a pre-mounted position (as shown in FIG. 14 and please further refer to FIG. 9). When the second rail 26 is moved along the mounting direction D1, the second rail 26 can be guided by the guiding portion 48 of the first supporting member 24 (as shown in FIG. 15 and please further refer to FIG. 10) until the second rail 26 is guided and moved to the second supporting portion 46 of the first supporting member 24 (as shown in FIG. 16 and please further refer to FIG. 11). In such status, the second supporting portion 46 of the first supporting member 24 is able to be configured to support the end section 58 of the third wall 38a of the second rail 26, the second supporting portion 46 of the second supporting member 36 is able to be configured to support the end section 58 of the fourth wall 38b of the second rail 26 (as shown in FIG. 16 and please further refer to FIG. 11). In addition, the third supporting portion 49 of the first supporting member 24 has curved or convex contour to support the arc section 56 of the third wall 38a of the second rail 26, and the third supporting portion 49 of the second supporting member 36 has curved or convex contour to support the arc section 56 of the fourth wall 38b of the second rail 26.

In other words, when the second rail 26 is supported by the first supporting portion 44 of the first supporting member 24, the maintenance staff may just apply a force along the mounting direction D1 to push the second rail 26, such that the second rail 26 is able to be moved along the guiding portion 48 of the first supporting member 24 to the second supporting portion 46 of the second supporting member 36 and the second supporting portion 46 of the first supporting member 24 until the second rail 26 totally located in the passage 34 of the first rail 22. The second rail 26 is able to be supported by the plurality of rolling members 43 of the slide auxiliary device 42.

Figure 17:
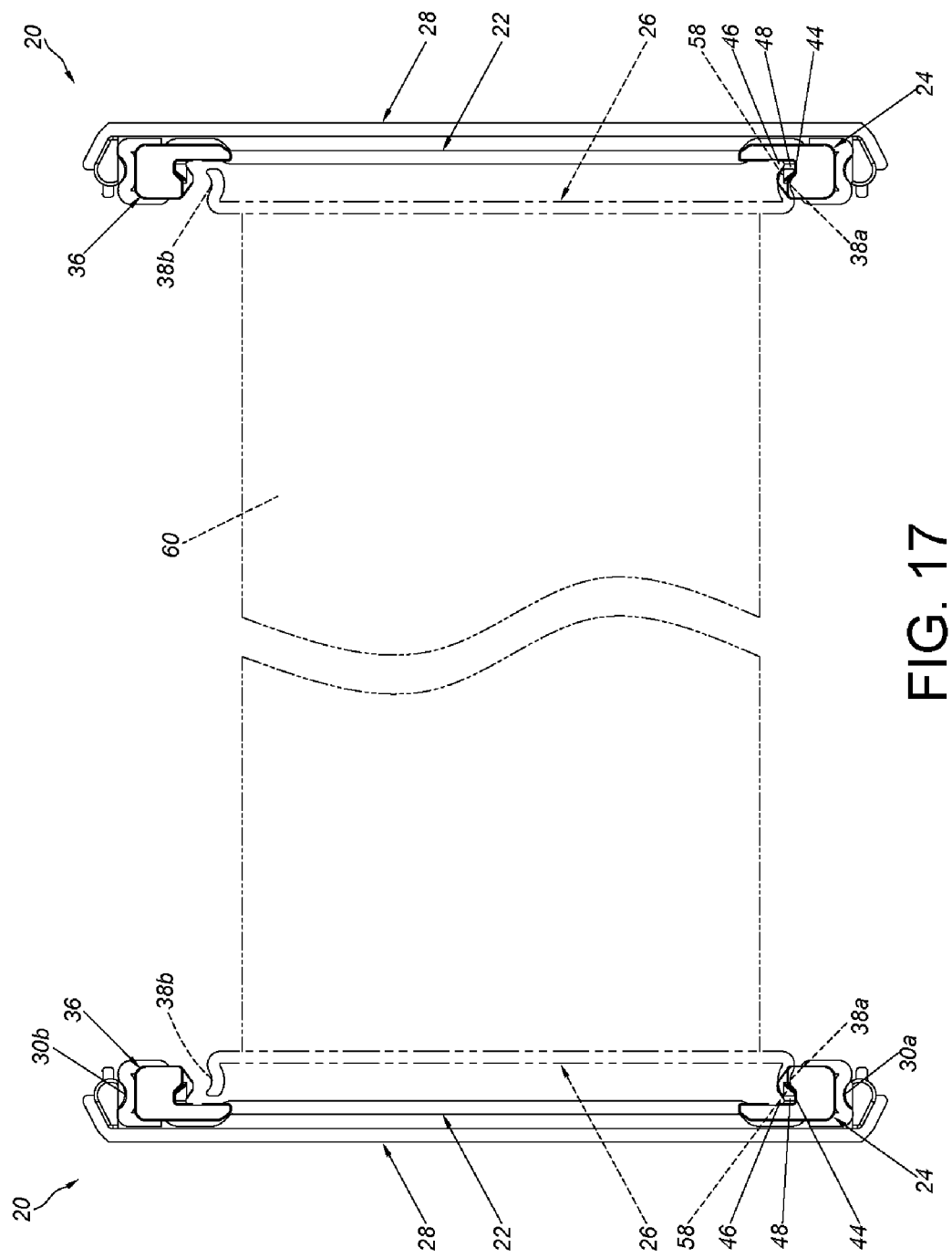
FIG. 17 a diagram illustrating two second rails of two slide rail assemblies respectively arranged on two sides of a carried object, and every second rail able to be supported by every corresponding first supporting portion of the first supporting member of the first rail according to the embodiment of the present invention.

As shown in FIG. 17 and FIG. 18, the two slide rail assemblies 20 can be arranged on two sides of a rack cabinet (not shown in figure), and each slide rail assembly 20 includes the first rail 22, the second rail 26 and the third rail 28. Wherein, the second rails 26 of the two slide rail assemblies 20 can be arranged on two sides of a carried object 60.

When the second rail 26 is detached from the passage 34 of the first rail 22 and the second rail 26 has to be reinserted again into the passage 34 of the first rail 22 from outside of the passage 34 of the first rail 22, similar to above mounting principle, the first supporting portion 44 of the first supporting member 24 is able to be configured to support the second rail 26 as a preliminary (as shown in FIG. 17 and please further refer to FIG. 9 and FIG. 14). When the second rail 26 is moved along the mounting direction D1, the second rail 26 is guided to the second supporting portion 46 of the first supporting member 24 through the guiding portion 48 of the first supporting member 24 (as shown in FIG. 18 and please further refer to FIG. 11 and FIG. 16). The second supporting portion 46 of the first supporting member 24 is configured to support the second rail 26.

It is noticed that, as shown in FIG. 5 and FIG. 7, the first supporting member 24 further includes a supporting section 240 and a connecting guide section 241. A distance is formed between the supporting section 240 and the first supporting portion 44 of the first supporting member 24 in the transverse direction (e.g., the Y-axis direction), and the connecting guide section 241 is connected to one side of the supporting section 240 and to one side of the first supporting portion 44 and is a guide inclined surface. When the second rail 26 enters the passage 34 of the first rail 22 from the entrance at the inclined angle and the end section 58 is located on the supporting section 240, the end section 58 will follow the location adjustment of the another second rail 26 on the another first supporting member 24 to be synchronously moved to the guiding section 241 in the transverse direction (e.g., the Y-axis direction), and the end section 58 is further guided to the first supporting portion 44. In other words, the guiding inclined surface (e.g., the connecting guide section 241) may be configured to guide the end section 58 of the third wall 38a of the second rail 26 into the first support portion 44 of the first support 24.

An embodiment of the present invention also provides a rail mounting method of the slide rail assembly 20. The rail mounting method includes the following steps:

Provide a first rail 22 having a passage 34, wherein a slide auxiliary device 42 is arranged in the passage 34, and the slide auxiliary device 42 includes a plurality of rolling members 43;

Provide a first supporting member 24 arranged on the first rail 22 and located on an entrance of the passage 34 (such as an entry of the passage 34), wherein the first supporting member 24 includes a first supporting portion 44, a second supporting portion 46 and the guiding portion 48 arranged between the first supporting portion 44 and the second supporting portion 46, a height difference K is formed between the first supporting portion 44 and the second supporting portion 46;

Provide a second rail 26, wherein when the second rail 26 is mounted into the passage 34 of the first rail 22 from outside of the passage 34 of the first rail 22, the first supporting portion 44 of the first supporting member 24 is configured to support the second rail 26; and Push the second rail 26 along a mounting direction D1 to move the second rail 26, such that the second rail 26 is guided to the second supporting portion 46 through the guiding portion 48, wherein when the second rail 26 is further moved along the mounting direction D1, the plurality of rolling members 43 of the slide auxiliary device 42 are configured to support the second rail 26. Since the technical features of the mounting method are illustrated above and disclosed on FIG. 9 to FIG. 16, related description is omitted herein for simplicity.

Compared to the prior art, the slide rail assembly 20 of the present embodiment has advantages over the prior art by the following perspectives:

1. The first supporting member 24 is arranged on the first rail 22, and the first supporting member 24 includes the first supporting portion 44, the second supporting portion 46 and the guiding portion 48. When the second rail 26 is mounted into the passage 34 of the first rail 22 from outside of the passage 34 of the first rail 22, the second rail 26 can be supported by the first supporting portion 44 as a preliminary. When the second rail 26 is further moved along the mounting direction D1, the second rail 26 is guided to the second supporting portion 46 through the guiding portion 48, and the second supporting portion 46 is configured to support the second rail 26.

2. When the second rail 26 has mounted into the passage 34 of the first rail 22, the plurality of rolling members 43 of the slide auxiliary device 42 is able to be configured to support the second rail 26.

3. The first height H1 is defined between the first supporting portion 44 of the first supporting member 24 and the first supporting portion 44 of the second supporting member 36, and the second height H2 is defined between the second supporting portion 46 of the first supporting member 24 and the second supporting portion 46 of the second supporting member 36. The first height H1 is greater than the second height H2. The third height H3 is defined between the third wall 38a and the fourth wall 38b of the second rail 26. Wherein, the first height H1 is greater than the third height H3.

4. A longitudinal length of the third wall 38a of the second rail 26 is substantially greater than a longitudinal length of the fourth wall 38b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail comprising a first wall, a second wall and a first longitudinal wall connected between the first wall and the second wall, a passage being defined by the first wall, the second wall and the first longitudinal wall;
   a first supporting member arranged on the first rail, the first supporting member comprising a first supporting portion, a second supporting portion and a guiding portion arranged between the first supporting portion and the second supporting portion, the first supporting portion having a first transverse width, the second supporting portion having a second transverse width, and the first transverse width being greater than the second transverse width; and
   a second rail;

wherein when the second rail is mounted into the passage of the first rail from outside of the passage of the first rail, the first supporting portion is configured to support the second rail, when the second rail is moved along a mounting direction, the second rail is guided to the second supporting portion through the guiding portion and the second supporting portion is configured to support the second rail.

2. The slide rail assembly of claim 1, wherein the guiding portion has an inclined surface or an arc surface.

3. The slide rail assembly of claim 1, wherein a height difference is formed between the first supporting portion and the second supporting portion.

4. The slide rail assembly of claim 1, wherein the first supporting member is located on an entrance of the passage adjacent to the first wall of the first rail, the first supporting member further comprises identifying features located around the entrance.

5. The slide rail assembly of claim 4, further comprising a second supporting member arranged on the first rail, the second supporting member being located on the entrance of the passage adjacent to the second wall of the first rail, wherein the second supporting member and the first supporting member have substantially the same structural configuration.

6. The slide rail assembly of claim 5, wherein a first height is defined between the first supporting portion of the first supporting member and the first supporting portion of the second supporting member, a second height is defined between the second supporting portion of the first supporting member and the second supporting portion of the second supporting member, the first height is greater than the second height.

7. The slide rail assembly of claim 6, wherein the second rail comprising a third wall, a fourth wall and a second longitudinal wall connected between the third wall and the fourth wall, a third height is defined between the third wall and the fourth wall, the first height is greater than the third height.

8. The slide rail assembly of claim 7, wherein a longitudinal length of the third wall of the second rail is substantially greater than a longitudinal length of the fourth wall.

9. The slide rail assembly of claim 7, wherein the third wall of the second rail comprises an arc section and an end section connected to the arc section, the first supporting member further comprises a third supporting portion adjacent to the second supporting portion, when the second rail is mounted into the passage of the first rail from outside of the passage of the first rail, the first supporting portion of the first supporting member is configured to support the end section of the third wall of the second rail, when the second rail is moved along the mounting direction, the second rail is guided to the second supporting portion through the guiding portion of the first supporting member, the second supporting portion of the first supporting member is configured to support the end section of the third wall of the second rail, the third supporting portion of the first supporting member is configured support the arc section of the third wall of the second rail.

10. The slide rail assembly of claim 1, wherein when the second rail is mounted into the passage of the first rail, the third wall, the fourth wall and the second longitudinal wall of the second rail are respectively adjacent to the first wall, the second wall and the first longitudinal wall of the first rail.

11. A slide rail assembly, comprising:
a first rail comprising a first wall, a second wall and a first longitudinal wall connected between the first wall and the second wall, a passage is defined by the first wall, the second wall and the first longitudinal wall;
a sliding auxiliary device arranged in the passage of the first rail, the sliding auxiliary device comprising a plurality of rolling members;
a first supporting member arranged on the first rail, the first supporting member comprising a first supporting portion, a second supporting portion and a guiding portion arranged between the first supporting portion and the second supporting portion; and
a second rail;
wherein when the second rail is mounted into the passage of the first rail from outside of the passage of the first rail, the first supporting portion is configured to support the second rail, when the second rail is moved along a mounting direction, the second rail is guided to the second supporting portion through the guiding portion, the second supporting portion is configured to support the second rail;
wherein when the second rail is further moved along the mounting direction and mounted into the passage of the first rail, the plurality of rolling members of the sliding auxiliary device are configured to support the second rail.

12. The slide rail assembly of claim 11, wherein the guiding portion has an inclined surface or an arc surface.

13. The slide rail assembly of claim 11, wherein a height difference is formed between the first supporting portion and the second supporting portion.

14. The slide rail assembly of claim 11, wherein the first supporting member is located on an entrance of the passage adjacent to the first wall of the first rail.

15. The slide rail assembly of claim 14, further comprising a second supporting member arranged on the first rail, the second supporting member is located on the entrance of the passage adjacent to the second wall of the first rail, wherein the second supporting member and the first supporting member have substantially a same structural configuration.

16. The slide rail assembly of claim 15, wherein a first height is defined between the first supporting portion of the first supporting member and the first supporting portion of the second supporting member, a second height is defined between the second supporting portion of the first supporting member and the second supporting portion of the second supporting member, the first height is greater than the second height.

17. The slide rail assembly of claim 16, wherein the second rail comprises a third wall, a fourth wall and a second longitudinal wall connected between the third wall and the fourth wall, a third height is defined between the third wall and the fourth wall, the first height is greater than the third height.

18. The slide rail assembly of claim 17, wherein a longitudinal length of the third wall of the second rail is substantially greater than a longitudinal length of the fourth wall.

19. The slide rail assembly of claim 17, wherein the third wall of the second rail comprises an arc section and an end section connected to the arc section, the first supporting member further comprises a third supporting portion adjacent to the second supporting portion, when the second rail is mounted into the passage of the first rail from outside of the passage of the first rail, the first supporting portion of the first supporting member is configured to support the end section of the third wall of the second rail, when the second rail is moved along the mounting direction, the second rail is guided to the second supporting portion through the guiding portion of the first supporting member, the second supporting portion of the first supporting member is configured to support the end section of the third wall of the second rail, the third supporting portion of the first supporting member is configured support the arc section of the third wall of the second rail.

20. A rail mounting method, comprising:
providing a first rail having a passage, a slide auxiliary device being arranged in the passage of the first rail, the sliding auxiliary device comprising a plurality of rolling members;
providing a first supporting member arranged on the first rail and located on an entrance of the passage, the first supporting member comprising a first supporting portion, a second supporting portion and a guiding portion arranged between the first supporting portion and the second supporting portion, a height difference is formed between the first supporting portion and the second supporting portion;
providing a second rail, wherein when the second rail is mounted into the passage of the first rail from outside of the passage of the first rail, the first supporting portion of the first supporting member is configured to support the second rail; and
moving the second rail along a mounting direction, such that the second rail is guided to the second supporting portion through the guiding portion, wherein when the second rail is further moved along the mounting direction, the plurality of the rolling members of the sliding auxiliary device are configured to support the second rail.

* * * * *